(12) United States Patent
Ni et al.

(10) Patent No.: US 11,049,952 B2
(45) Date of Patent: Jun. 29, 2021

(54) INTEGRATED ENHANCEMENT/DEPLETION MODE HEMT

(71) Applicant: SUZHOU HAN HUA SEMICONDUCTOR CO., LTD, Jiangsu (CN)

(72) Inventors: Xianfeng Ni, Jiangsu (CN); Qian Fan, Jiangsu (CN); Wei He, Jiangsu (CN)

(73) Assignee: SUZHOU HAN HUA SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 16/985,468

(22) Filed: Aug. 5, 2020

(65) Prior Publication Data

US 2020/0381533 A1    Dec. 3, 2020

Related U.S. Application Data

(62) Division of application No. 16/413,633, filed on May 16, 2019, now Pat. No. 10,777,653.

(30) Foreign Application Priority Data

Jan. 4, 2019    (CN) .......................... 201910003343.6

(51) Int. Cl.

| H01L 29/66 | (2006.01) |
|---|---|
| H01L 29/20 | (2006.01) |
| H01L 27/085 | (2006.01) |
| H01L 29/778 | (2006.01) |
| H01L 29/205 | (2006.01) |
| H01L 27/06 | (2006.01) |

(52) U.S. Cl.
CPC .... *H01L 29/66462* (2013.01); *H01L 27/0605* (2013.01); *H01L 27/085* (2013.01); *H01L 29/2003* (2013.01); *H01L 29/205* (2013.01); *H01L 29/7781* (2013.01); *H01L 29/7786* (2013.01)

(58) Field of Classification Search
CPC ........... H01L 27/7786; H01L 27/66462; H01L 27/2003; H01L 27/0605; H01L 27/085
See application file for complete search history.

(56) References Cited

U.S. PATENT DOCUMENTS 9,559,012 B1    1/2017 Chu et al.
2014/0014897 A1*    1/2014 Kim ........................ H01L 33/12
257/13

(Continued)

*Primary Examiner* — Phuc T Dang
(74) *Attorney, Agent, or Firm* — Westerman, Hattori, Daniels & Adrian, LLP

(57) ABSTRACT

An integrated enhancement/depletion mode high electron mobility transistor (HEMT) includes a substrate, a first buffer layer, a first barrier layer, a first channel layer, a first source, a first drain, a first gate, a second buffer layer, a second barrier layer, a second channel layer, a second source, a second drain, and a second gate. The first buffer layer is on the substrate. The first barrier layer is on a first area of the first buffer layer, the first channel layer is on the first barrier layer, and the first source, the first drain, and the first gate are on the first channel layer. The second buffer layer is on a second area of the first buffer layer, the second bather layer is on the second buffer layer, the second channel layer is on the second barrier layer, and the second source, the second drain, and the second gate are on the second channel layer.

18 Claims, 3 Drawing Sheets

(56) References Cited

U.S. PATENT DOCUMENTS

| | | | |
|---|---|---|---|
| 2014/0042452 A1* | 2/2014 | Pendharkar | H01L 21/8252 257/76 |
| 2014/0138617 A1* | 5/2014 | Lai | H01L 33/06 257/13 |
| 2016/0300941 A1 | 10/2016 | Cheng | |
| 2017/0117403 A1* | 4/2017 | Okita | H01L 29/42356 |
| 2017/0345921 A1 | 11/2017 | Feng | |
| 2018/0076291 A1* | 3/2018 | Koyama | H01L 29/7786 |
| 2018/0308966 A1* | 10/2018 | Jacquet | H01L 29/205 |
| 2019/0035895 A1 | 1/2019 | Xie et al. | |
| 2019/0348411 A1* | 11/2019 | Chen | H01L 29/205 |
| 2020/0144345 A1* | 5/2020 | Cha | H01L 27/3265 |
| 2020/0176389 A1* | 6/2020 | Huang | H01L 29/7786 |

* cited by examiner

INTEGRATED ENHANCEMENT/DEPLETION MODE HEMT

CROSS-REFERENCE TO RELATED APPLICATIONS

This is a divisional application of U.S. application Ser. No. 16/413,633, filed on May 16, 2019, U.S. Pat. No. 10,777,653, which claims benefit of the filing date of Chinese Patent Application No. 201910003343.6, filed on Jan. 4, 2019, the disclosure of which is hereby incorporated in its entirety by reference.

TECHNICAL FIELD

The present invention relates to the technical field of semiconductor manufacturing, in particular to an integrated enhancement/depletion mode HEMT and a method for manufacturing the same.

BACKGROUND

As a representative of the third generation of semiconductor materials, gallium nitride (GaN) has many excellent characteristics, such as high critical electric field for breakdown, high electron mobility, high two-dimensional electron gas concentration, and good high temperature working ability, etc. The third generation of semiconductor devices based on gallium nitride, such as high electron mobility transistor (HEMT), heterostructure field effect transistor (HFET) and the like, have been put into use, and have obvious advantages especially in areas requiring high power and high frequency such as radio frequency and microwave, etc.

GaN HEMT is mainly used in the communication industry and power electronics industry, but it also has unique advantages in the field of high-speed digital circuits and mixed signals. GaN HEMT has excellent high temperature stability and can greatly reduce the cost of the circuit in terms of heat source and temperature field control. The wide bandgap characteristics of GaN enable it to have both high electron saturation speed and high breakdown voltage, allowing a device to operate at higher voltages, which can improve the driving capability of the circuit. Therefore, compared with the traditional silicon-based technology, digital circuits based on GaN HEM can meet the requirements of operating under large current and voltage swings and in harsh environments, making it potentially of great application in corresponding fields.

In order to realize GaN HEMT-based digital circuits, it is necessary to realize monolithic integration of high-performance GaN-based HEMT. Compared with conventional D-mode (depletion mode) GaN HEMT, the E-mode (enhancement mode) GaN HEMT is relatively difficult to manufacture. However, the E-mod GaN HEMT is not only required to realize DCFL logic (Direct-Coupled FET Logic), but also its performance plays a crucial role in the characteristics of the circuit. Therefore, on the basis that the E-mod GaN HEMT is difficult to manufacture, it is even more difficult to realize the monolithic integration of E/D mode HEMT.

SUMMARY

The present application provides a method for manufacturing an integrated enhancement/depletion mode HEMT, which includes:

providing a substrate, and sequentially forming a first buffer layer, a first barrier layer, and a first channel layer on the substrate;

forming a dielectric layer on the first channel layer, and selectively etching the dielectric layer, the first channel layer, the first barrier layer, and the first buffer layer to expose a portion of the first buffer layer;

performing a regrowth on the exposed portion of the first buffer layer to sequentially form a second buffer layer, a second barrier layer, and a second channel layer; and removing the dielectric layer, forming a first source, a first drain, and a first gate on the first channel layer, and forming a second source, a second drain, and a second gate on the second channel layer.

In one embodiment, the first barrier layer has a thickness of 1 nm to 30 nm, and the second barrier layer has a thickness greater than that of the first barrier layer and less than 100 nm.

In one embodiment, the second barrier layer has a thickness of 1 nm to 30 nm, and the first barrier layer has a thickness greater than that of the second barrier layer and less than 100 nm.

In one embodiment, before selectively etching the dielectric layer, a photoresist layer is formed on the dielectric layer, and regions to be etched are defined on the photoresist layer.

In one embodiment, the first buffer layer includes a first doped layer in contact with the first barrier layer, and the first barrier layer includes a second doped layer in contact with the first doped layer.

In one embodiment, the second buffer layer includes a third doped layer in contact with the second barrier layer, and the second barrier layer includes a fourth doped layer in contact with the third doped layer.

In one embodiment, in the regrowth process, an n-type doping induced by impurities due to an exposure is formed on a regrowth interface of the first buffer layer, and electrons generated by the n-type doping become a part of the third doped layer after the second buffer layer is formed.

In one embodiment, the material of the dielectric layer is any one of silicon nitride, silicon dioxide, and silicon oxynitride.

Correspondingly, the present application also provides an integrated enhancement depletion mode HEMI; including:

a substrate;

a first buffer layer on the substrate;

a first barrier layer and a second buffer layer on the first buffer layer;

a first channel layer on the first barrier layer;

a second barrier layer on the second buffer layer and a second channel layer on the second barrier layer; and a first source, a first drain, and a first gate on the first channel layer, and a second source, a second drain, and a second gate on the second channel layer.

According to the integrated enhancement/depletion mode HEMT and the method for manufacturing the same provided by the present invention, an enhancement mode transistor and a depletion mode transistor can be integrated together, which is beneficial for increasing the application of gallium nitride HEMT devices and improving the characteristics of the circuits, and lay a foundation for realizing the monolithic integration of high-speed digital analog mixed signal radio frequency circuits. At the same time, by utilizing the regrowth of the buffer layer and the doping requirements, elections generated by impurities are made part of the doping layer, thus the doping concentration is improved while preventing excessive elections from interfering with the devices.

DETAILED DESCRIPTION

An integrated enhancement/depletion mode HEMT and a method for manufacturing the same proposed by the present invention will be described in further detail below with reference to the drawings and specific embodiments. Advantages and features of the present invention will become more apparent from tire following description and claims. It should be noted that the drawings that are all in a very simplified form and not drawn to precise scale are only for purposes of conveniently and clearly illustrating the embodiments of the present invention.

In the present invention, when referring herein to "a layer formed on another layer" may mean that a layer is formed on top of another layer, bid it does not necessarily mean that such layer is in direct physical or electrical contact with the another layer (e.g., there may be one or more oilier layers between the two layers). However, in some embodiments, the phrase "formed on . . . " may indicate that the layer is in a direct physical contact with at least a portion of the top surface of the another layer.

Figure 1:
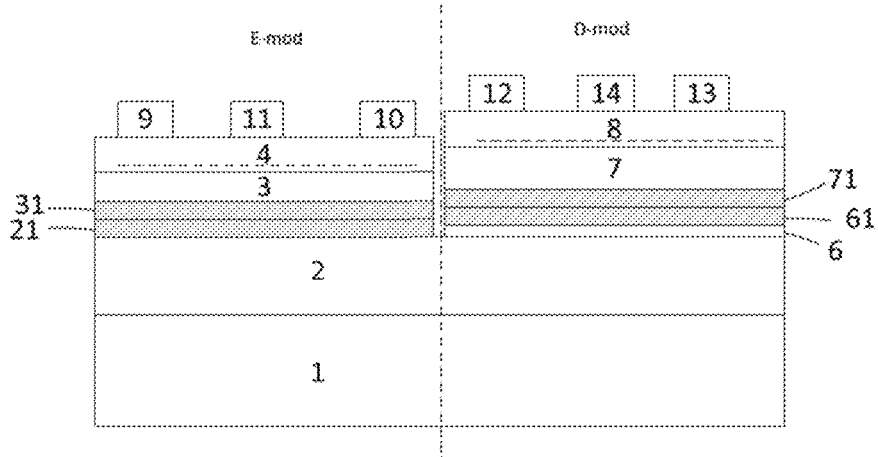
FIG. 1 is a structural diagram of an integrated enhancement depletion mode HEMT according to one embodiment.
Figure 2:
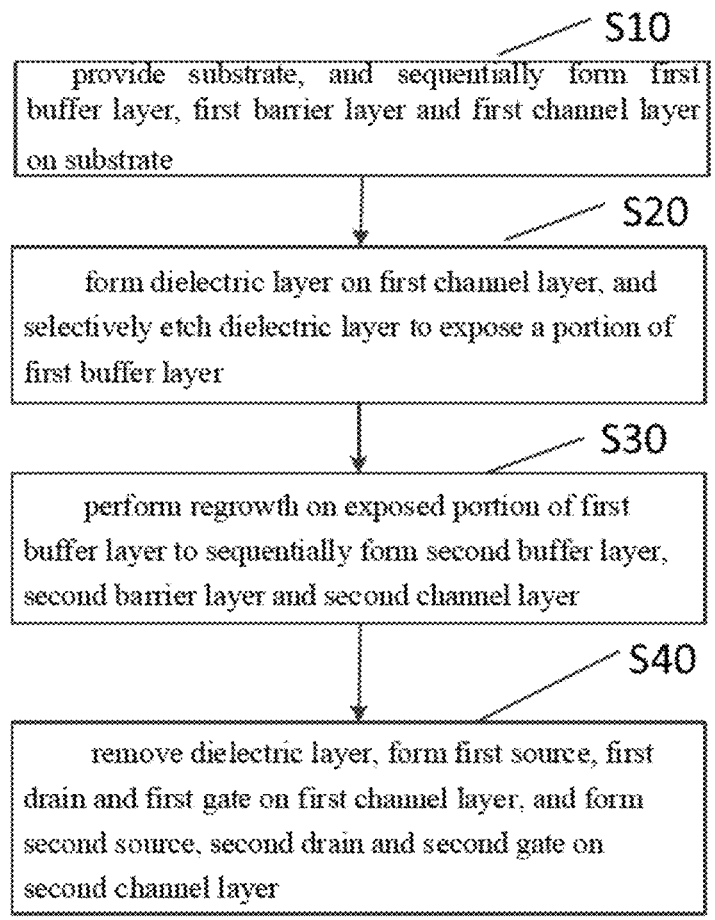
FIG. 2 is a flowchart of a method for manufacturing the integrated enhancement/depletion mode HEMT according to one embodiment.

An integrated enhancement/depletion mode HEMT described in this embodiment has a structure as shown in FIG. 1, including:

substrate 1, first buffer layer 2 on substrate 1, first barrier layer 3 and second buffer layer 6 on first buffer layer 2, first channel layer 4 on first barrier layer 3, second barrier layer 7 on second buffer layer 6, second channel layer 8 on second barrier layer 7, first source 9, first drain 10, and first gate 11 on first channel layer 4, and second source 12, second drain 13, and second gate Hon second channel layer 8.

The material of substrate 1 includes, but is not limited to, Si, SiC, GaN, or sapphire, etc. The material of first buffer layer 2 may be a group III metal nitride such as GaN, InN, AlN, AlGaN, InGaN, etc., and first buffer layer 2 has a nitrogen-face polarity. For example, if the material of first buffer layer 2 is GaN, then the first buffer layer is an N-face polar GaN buffer layer. The first barrier layer 3 may be a ternary or quaternary nitride compound semiconductor alloy such as AlGaN, InGaN, etc. The material of the first channel layer 4 may be a Group III metal nitride such as GaN, InN, AlN, AlGaN, InGaN, etc., which also has a nitrogen-face polarity and may be the same as or different from that of first buffer layer 2. For example, die material of first buffer layer 2 may be GaN, and the material of first channel layer 4 may be InN. On a surface of first channel layer 4 in contact with first barrier layer 3, a two-dimensional electron gas (shown by dashed lines in first channel layer 4 in FIG. 1) with high electron mobility and high electron density is formed, which serves as a conductive channel to allow an electric conduction in the device.

The material of second buffet layer 6 may be a group III metal nitride such as GaN, InN, AlN, AlGaN, InGaN, etc., and second buffer layer 6 also has a nitrogen-face polarity. The material of second buffer layer 6 may be the same as or different from that of first buffer layer 2. In one embodiment, the material of first buffer layer 2 may be GaN, and the material of second buffer layer 6 may be InN. Second harrier layer 7 may be made of a ternary or quaternary nitride compound semiconductor alloy which may be the same as or different from the material of first barrier layer 3. The material of second channel layer 8 may be a Group III metal nitride such as GaN, InN, AlN, AlGaN, InGaN, etc., which also has a nitrogen-face polarity and may be the same as or different from that of second buffer layer 6. For example, the material of second buffer layer 6 may be GaN, and the material of second channel layer 8 may be InN. On a surface of second channel layer 8 in contact with second barrier layer 7, a two-dimensional electron gas (shown by dashed lines in second channel layer 8 in FIG. 1) with high electron mobility and high electron density is formed, which serves as a conductive channel to allow an electric conduction in the device.

First source 9, first drain 10, and first gate 11 are provided on first Channel layer 4, and first gate 11 is located between first source 9 and first drain 10. First source 9 and first drain 10 may be any one or a combination of Ti, Pt, Au, W, and Ni. First gate 11 may be a metal stack of nickel/gold or platinum/gold. Second source 12, second drain 13, and second gate 14 are provided on second channel layer 8, and second gate 14 is located between second source 12 and second drain 13. Second source 12 and second drain 13 may be any one or a combination of Ti, Pt, Au, W, and Ni. Second gate 14 may be a metal stack of nickel/gold or platinum/gold.

In this embodiment, since the barrier layer is located below the conductive channel, a doping process is required to eliminate or degrade the radio frequency dispersion. Specifically, first buffer layer 2 includes first doped layer 21 in contact with first barrier layer 3. First bather layer 3 includes second doped layer 31 in contact with first doped layer 21. Second buffer layer 6 includes third doped layer 61 in contact with second barrier layer 7. Second barrier layer 7 includes fourth doped layer 71 in contact with third doped layer 61. A dopant in the doped layers is silicon ion or germanium ion, and the doping concentration is $1\times10^{18}/cm^3$ to $2\times10^{19}/cm^3$.

In this embodiment, first barrier layer 3 has a thickness of 1 nm to 30 mm, and the specific thickness depends on the composition part of ternary or quaternary metal material, such as the composition part of Al in AlGaN. The thickness of second barrier layer 7 needs to be greater than that of first barrier layer 3 less than 100 nm. Optionally, the thickness of second barrier layer 7 is 1 nm to 30 nm, and the specific thickness depends on the composition part of ternary or quaternary metal material, such as the composition part of In in InGaN. The thickness of first barrier layer 3 needs to be greater than that of second barrier layer 7 and less than 100 nm.

The enhancement mode FET means that the two-dimensional electron gas in the channel can be cut off even when no voltage is applied to the gate, and the channel is turned on when a forward voltage is applied to the gate. Therefore, when the first barrier layer is relatively thin, first gate 11, first source 9, first drain 10, and the correspondingly underlying first channel layer 4, first barrier layer 3, first buffer layer 2, and substrate 1 constitute an enhancement mode FET. While, second gate 14, second source 12, and second drain 13, and the correspondingly underlying second channel layer 8, second barrier layer 7, second buffer layer 6, first buffer layer 2, and substrate 1 constitute a depletion mode FET. However, when the second barrier layer is relatively thin, second gate 14, second source 12, second drain 13, and the correspondingly underlying second channel layer 8, second barrier layer 7, second buffer layer 6, first buffer layer 2, and substrate 1 constitute an enhancement mode FET. While, first gate 11, first source 9, and first drain 10, and the correspondingly underlying first channel layer 4, first barrier layer 3, first buffer layer 2, and substrate 1 constitute a depletion mode FET.

The integrated enhancement depletion mode HEMT provided by this embodiment can integrate the enhancement mode and depletion mode transistors together, which is beneficial for increasing the application of gallium nitride HEMT devices and improving the characteristics of the circuits, and lay a foundation for realizing a monolithic integration of high-speed digital analog mixed signal radio frequency circuits.

Correspondingly, referring to FIGS. 2 to 6, the present application also provides a method for manufacturing an integrated enhancement/depletion mode HEMT, which includes the following steps.

S10: a substrate is provided, and a first buffer layer, a first barrier layer, and a first channel layer are sequentially formed on the substrate.

Figure 3:
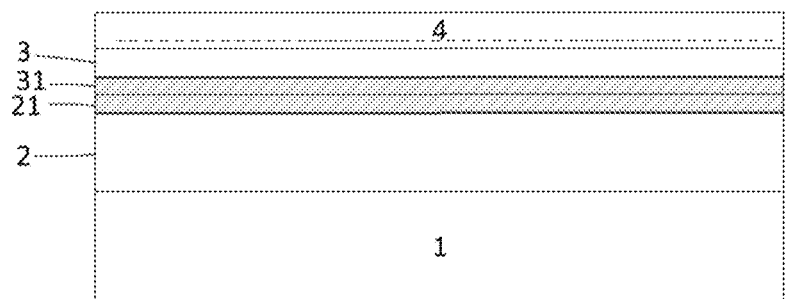
FIGS. 3-6 are schematic diagrams of manufacturing the integrated enhancement/depletion mode HEMT according to one embodiment.

Specifically, as shown in FIG. 3, the material of substrate 1 includes, but is not limited to, Si, SiC, GaN, or sapphire, etc. The material of first buffer layer 2 may be a group III metal nitride such as GaN, AlGaN, InGaN, etc. First buffer layer 2 has a nitrogen-face polarity. For example, if the material of first buffer layer 2 is GaN, then the first buffer layer is an N-polar GaN buffer layer. First barrier layer 3 may be a ternary or quaternary nitride compound semiconductor alloy such as AlGaN, InGaN, etc. The material of first channel layer 4 may be a group ITT metal nitride such as GaN, InN, AlN, AlGaN, InGaN, etc., which also has a nitrogen-face polarity, and may be the same as or different from the material of first buffer layer 2. For example, the material of first buffer layer 2 may be GaN, and the material of first channel layer 4 may be InN. On a surface of first channel layer 4 in contact with first barrier layer 3, a two-dimensional electron gas (shown by dashed lines in FIG. 3) with high electron mobility and high electron density is formed, which serves as a conductive channel to allow an electric conduction in the device.

In order to grow an epitaxial layer, the surface of the substrate may be first cleaned with chemical reagents such as acetone and methanol, and then dried with nitrogen. After that, the substrate may be heated to a certain temperature (which can be 100° C. to 120° C.) in a gaseous environment (hydrogen, nitrogen, or a mixed gas of hydrogen and nitrogen) or vacuum by metal organic chemical vapor deposition (MOCVD), molecular beam epitaxy, or DC sputtering. By controlling the introduction of gas sources of different elements, the buffer layers, the barrier layers, and the channel layers can be respectively grown and formed. For example, in the above process, a gas including a gallium source and ammonia gas are first introduced to form first buffer layer 2, based on that, a gas including an aluminum source is introduced to form first barrier layer 3, and then the gas including the aluminum source is removed to form first channel layer 4. The thickness of first barrier layer 3 may be controlled by controlling the time of growth. The specific thickness of first barrier layer 3 depends on the composition part of Al in AlGaN and a threshold voltage of the FET.

In this embodiment, since first barrier layer 3 is located below the conductive channel, a doping process is required to eliminate or degrade the radio frequency dispersion. First buffer layer 2 includes first doped layer 21 in contact with first barrier layer 3, and first barrier layer 3 includes second doped layer 31 in contact with first doped layer 21. The process of forming first doped layer 21 and second doped layer 31 may be included in the growth process described above. Namely, an n-type dopant is introduced to form first doped layer 21 before the formation of the first buffer layer is completed, and then the n-type dopant and the gas including the aluminum source are continuously introduced to form second doped layer 31. The n-type dopant may be silicon ion, germanium ion, or oxygen ion, and the doping concentration is $1 \times 10^{18}/cm^3$ to $2 \times 10^{19}/cm^3$.

S20: a dielectric layer is formed on the first channel layer, and the dielectric layer, the first channel layer, the first barrier layer, and the first buffer layer are selectively etched to expose a portion of the first buffer layer.

Figure 4:
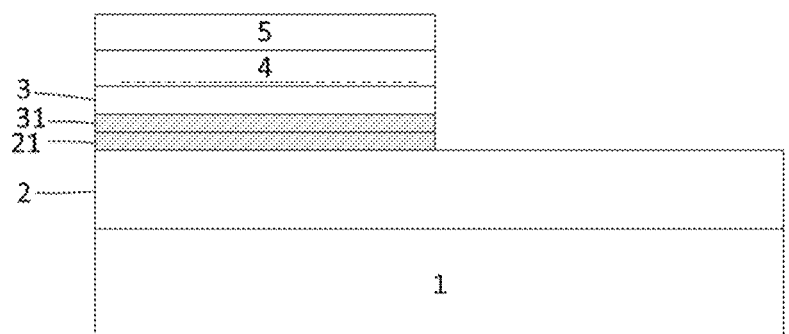

Specifically, dielectric layer 5 may be formed by a chemical vapor deposition method, and the material of dielectric layer 5 includes, but is not limited to, silicon oxide, silicon nitride, or silicon oxynitride, etc. Dielectric layer 5 has a thickness of 1 nm to 1000 nm. Before etching dielectric layer 5, a layer of photoresist may be coated on the dielectric layer, and then regions to be etched are defined the photoresist layer by exposure, development and the like. After that, the photoresist in the regions to be etched and the dielectric layer, the first channel layer, the first barrier layer, and the first buffer layer at positions corresponding to the regions to be etched may be removed by dry or wet etching to expose a portion of first barrier layer 3. After the etching is completed, the remaining photoresist is removed. The exposed portion of first barrier layer 3 may be continuous or discontinuous. Here, only the continuous case is shown in FIG. 4. It can be understood that the example shown in the drawing will not binder the understanding of the scheme by those skilled in the art. The depth of etching may go beyond the first doped layer as shown, or may be stopped at the surface of the first doped layer.

S30: a regrowth is performed on the exposed portion of the first buffer layer to sequentially form a second buffer layer, a second barrier layer, and a second channel layer.

Figure 5:
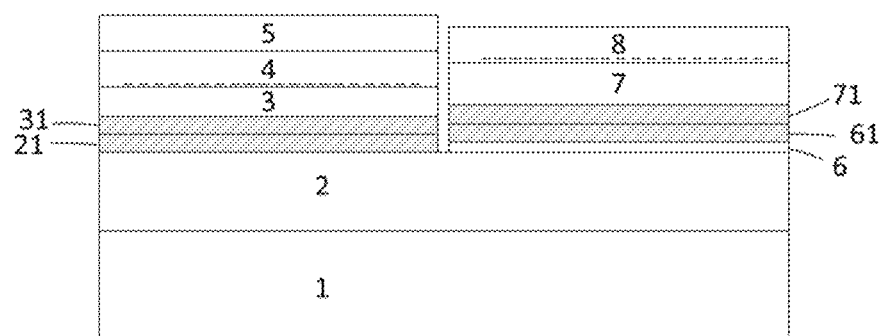

Specifically, referring to FIG. 5, after a portion of first buffer layer 2 is exposed, the regrowth is performed on the exposed portion of first buffer layer 2 to form second buffer layer 6. Moreover, due to the properties, of the material of the dielectric layer 5, the dielectric layer 5 is unsuitable for the regrowth and therefore no second buffer layer 6 will be formed on dielectric layer 5. In some cases, a polycrystalline material is formed on dielectric layer 5 during the above process, and the formed polycrystalline material may be removed by a lift-off process. After second buffer layer 6 is formed, second barrier layer 7 and second channel layer 8 are formed on second buffer layer 6. The material of second buffer layer 6 may be a group III metal nitride such as GaN, InN, AlN, AlGaN, InGaN, etc., and second buffer layer 6 also has a nitrogen-face polarity. The material of second buffer layer 6 may be the same as or different from that of first buffer layer 2. For example, the material of first buffer layer 2 may be GaN, and the material of second buffer layer 6 may be InN. Second barrier layer 7 may be made of a ternary or quaternary nitride compound semiconductor alloy which may be the same material as or a different material from first barrier layer 3. The material of second channel layer 8 may be a Group III metal nitride such as GaN, InN, AlN, AlGaN, InGaN, etc., which also has a nitrogen-face polarity, and may be the same as or different from the material of second buffer layer 6. For example, the material of the second buffer layer may be GaN, and the material of the second channel layer may be InN. On a surface of second channel layer 8 in contact with second barrier layer 7, a two-dimensional electron gas (shown by dashed lines in second channel layer 8 in FIG. 5) with high electron mobility and high electron density is formed, which serves as a conductive channel to allow an electric conduction in the device.

Similarly, since second barrier layer 7 is located below the conductive channel, a doping process is required to eliminate or degrade the radio frequency dispersion. Second buffer layer 6 includes third doped layer 61 in contact with second barrier layer 7, and second barrier layer 7 includes fourth doped layer 71 in contact with third doped layer 61. The method of forming the second buffer layer, the second barrier layer, and the second channel layer is the same as that of forming the first buffer layer, the first barrier layer, and the first channel layer. It should be noted, however, that an n-type doping induced by impurities (silicon ions or oxygen ions) due to surface exposure is funned at a regrowth interface, and the doping concentration is $1\times10^{15}/cm^3$ to $2\times10^{19}/cm^3$. In a conventional group III nitride HEMT structure obtained by regrowth, the n-type doping at the regrowth interface has a great influence on the performance of the device, and even causes failure and pinch-off of the device. In this embodiment, after the growth of the second buffer layer is completed, the n-type doped electrons become a part of the third doped layer, thus the doping concentration is increased while preventing excessive electrons from interfering with the device.

S40: the dielectric layer is removed, a first source, a first drain, and a first gate are formed on the first channel layer, and a second source, a second drain, and a second gate are formed on the second channel layer.

Figure 6:
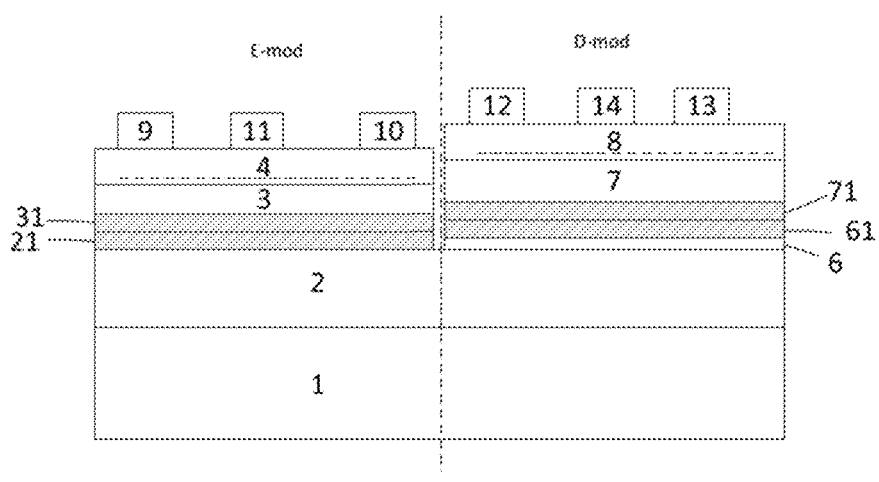

Specifically, dielectric layer 5 may be removed by a dry or wet etching. Then, first source 9, first drain 10, and first gate 11 are formed on first channel layer 4 by metal evaporation. Also, second source 12, second drain 13, and second gate 14 are formed on second channel layer 8 by metal evaporation, and the structure of the formed device is shown in FIG. 6. The process of forming the source, the drain, and the gate is a well-known technology in the art and will not be described further herein.

In this embodiment, first bather layer 3 has a thickness of 1 nm to 30 nm, and the specific thickness depends on the composition part of the ternary or quaternary metal material, such as the composition part of Al in AlGaN. The thickness of second barrier layer 7 needs to be eater than that of first barrier layer 3 and less than 100 nm. Optionally, the thickness of second barrier layer 7 is 1 nm to 30 nm, and the specific thickness depends on the composition part of the ternary or quaternary metal material, such as the composition part of In in InGaN. The thickness of first bather layer 3 needs to be greater than that of second barrier layer 7 and less than 100 nm.

The enhancement mode FET means that the two-dimensional electron gas in the channel can be cut off even when no voltage is applied to the gate, and the channel is turned on when a forward voltage is applied to the gate. Therefore, when the first barrier layer is relatively thin, first gate 11, first source 9, first drain 10, and the correspondingly underlying first channel layer 4, first barrier layer 3, first buffer layer 2, and substrate 1 constitute an enhancement mode FET. While, second gate 14, second source 12, second drain 13, and the correspondingly underlying second channel layer 8, second barrier layer 7, second buffer layer 6, first buffer layer 2, and substrate 1 constitute a depletion mode FET. However, when the second barrier layer is relatively thin, second gate 14, second source 12, second drain 13, and the correspondingly underlying second channel layer 8, second barrier layer 7, second buffer layer 6, first buffer layer 2, and substrate 1 constitute an enhancement mode FET. While, first gate 11, first source 9, and first chain 10, and correspondingly underlying first channel layer 4, first barrier layer 3, first buffer layer 2, and substrate 1 constitute a depletion mode FET.

The technical features of the above-mentioned embodiments can be combined arbitrarily. In order to simplify the description, not all possible combinations of the technical features of the above-mentioned embodiments have been described. However, as long as there is no contradiction in the combination of these technical features, it should be considered as falling within the scope described in this specification.

The above-mentioned embodiments only represent several embodiments of the present invention, and their descriptions are specific and detailed, but they should not be construed as limiting the scope of the present invention. It should be pointed out that for those of ordinary skill in the art, several modifications and improvements may be made without departing from the concept of the present invention, which are all within the protection scope of the present invention. Therefore, the protection scope of the present invention shall be subject to the appended claims.

What is claimed is:

1. An integrated enhancement/depletion mode HEMT, comprising:
   a substrate;
   a first buffer layer on the substrate;
   a first barrier layer on a first area of the first buffer layer, a first channel layer on the first barrier layer, and a first source, a first drain, and a first gate on the first channel layer;
   a second buffer layer on a second area of the first buffer layer, a second barrier layer on the second buffer layer, a second channel layer on the second barrier layer, and a second source, a second drain, and a second gate on the second channel layer;
   wherein the second buffer layer comprises a third doped layer in contact with the second barrier layer, the third doped layer is formed during forming the second buffer layer, and impurities for n-type doping in the third doped layer comes from an exposed surface of the first buffer layer.

2. The integrated enhancement/depletion mode HEMT according to claim 1, wherein a thickness of the first barrier layer differs from a thickness of the second barrier layer.

3. The integrated enhancement/depletion mode HEMT according to claim 1, wherein the first gate, the first source, the first drain, the first channel layer, the first barrier layer, and the first buffer layer constitute an enhancement mode FET, and the second gate, the second source, the second drain, the second channel layer, the second barrier layer, the second buffer layer, and the first buffer layer constitute a depletion mode FET.

4. The integrated enhancement/depletion mode HEMT according to claim 3, wherein a thickness of the first barrier layer and is in a range from 1 nm to 30 nm, and a thickness of the second barrier layer is less than 100 nm.

5. The integrated enhancement/depletion mode HEMT according to claim 3, wherein a thickness of the first barrier is greater than a thickness of the second barrier layer.

6. The integrated enhancement/depletion mode HEMT according to claim 1, wherein the first barrier layer and the second barrier layer are both ternary or quaternary nitride compound semiconductor alloys.

7. The integrated enhancement/depletion mode HEMT according to claim 1, wherein the first buffer layer comprises a first doped layer in contact with the first barrier layer.

8. The integrated enhancement/depletion mode HEMT according to claim 7, wherein a doping type of the first doping layer is n-type doping, a dopant of the first doping layer includes silicon ions, geranium ions or oxygen ions, and a doping concentration of the first doping layer is in a range from $1 \times 10^{18}/cm^3$ to $2 \times 10^{19}/cm^3$.

9. The integrated enhancement/depletion mode HEMT according to claim 7, wherein the first barrier layer comprises a second doped layer in contact with the first doped layer.

10. The integrated enhancement/depletion mode HEMT according to claim 9, wherein a doping type of the second doped layer is n-type doping, a dopant of the second doped layer includes silicon ions, germanium ions or oxygen ions, and a doping concentration is in a range from $1 \times 10^{18}/cm^3$ to $2 \times 10^{19}/cm^3$.

11. The integrated enhancement/depletion mode HEMI according to claim 1, wherein a doping type of the third doped layer is n-type doping, a dopant of the third doped layer includes silicon ions, germanium ions or oxygen ions, and a doping concentration of the third doped layer is in a range from $1 \times 10^{18}/cm^3$ to $2 \times 10^{19}/cm^3$.

12. The integrated enhancement/depletion mode HEMT according to claim 1, wherein the impurities generate a n-type doping concentration in a range of from $1 \times 10^{15}/cm^3$ to $2 \times 10^{19}/cm^3$.

13. The integrated enhancement/depletion mode HEMT according to claim 1, wherein the second barrier layer comprises a fourth doped layer in contact with the second buffer layer.

14. The integrated enhancement/depletion mode HEMI according to claim 13, wherein a doping type of the fourth doped layer is n-type doping, a dopant of the fourth doped layer includes silicon ions, germanium ions or oxygen ions, and a doping concentration of the fourth doped layer is in a range from $1 \times 10^{18}/cm^3$ to $2 \times 10^{19}/cm^3$.

15. The integrated enhancement/depletion mode HEMT according to claim 1, Wherein the first buffer layer, the first channel layer, the second buffer layer and the second channel layer includes group III metal nitrides.

16. The integrated enhancement/depletion mode HEMT according to claim 1, wherein a two-dimensional electron gas channel is formed at an interface of the second barrier layer and the second channel layer.

17. The integrated enhancement/depletion mode HEMT according to claim 1, wherein a two-dimensional electron gas channel is formed at an interface of the first channel layer and the first barrier layer.

18. The integrated enhancement/depletion mode HEMT according to claim 1, wherein metal electrodes of the first source, the first drain, the second source, the second drain are made of at least one of Ti, Pt, Au, W, and Ni, and metal electrodes of the first gate and the second gate are both a metal stack of nickel/gold or platinum/gold.

\* \* \* \* \*